(12) United States Patent
Lynch et al.

(10) Patent No.: US 8,957,577 B2
(45) Date of Patent: Feb. 17, 2015

(54) INTEGRATED THERMAL SPREADING

(75) Inventors: Stephen Brian Lynch, Portola Valley, CA (US); Fletcher R. Rothkopf, Los Altos, CA (US); Scott Andrew Myers, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 417 days.

(21) Appl. No.: 13/251,108

(22) Filed: Sep. 30, 2011

(65) Prior Publication Data

US 2013/0082908 A1 Apr. 4, 2013

(51) Int. Cl.
*H01L 51/50* (2006.01)
*H01L 51/52* (2006.01)
*G06F 1/20* (2006.01)

(52) U.S. Cl.
CPC .............. *H01L 51/529* (2013.01); *G06F 1/203* (2013.01)
USPC .............................. 313/504; 313/506; 257/40

(58) Field of Classification Search
USPC .................. 313/504, 506; 315/169.3; 257/40
See application file for complete search history.

(56) References Cited

U.S. PATENT DOCUMENTS

| | | | |
|---|---|---|---|
| 6,967,439 B2 | 11/2005 | Cok et al. | |
| 7,903,227 B2 | 3/2011 | Kang et al. | |
| 2002/0043929 A1 | 4/2002 | Tazawa | |
| 2005/0068738 A1 | 3/2005 | Kim et al. | |
| 2005/0285520 A1* | 12/2005 | Cok | 313/512 |
| 2007/0159078 A1 | 7/2007 | Park et al. | |
| 2008/0018569 A1 | 1/2008 | Sung et al. | |
| 2009/0001881 A1* | 1/2009 | Nakayama | 313/504 |
| 2009/0051293 A1 | 2/2009 | Houdek et al. | |
| 2009/0267526 A1 | 10/2009 | Sung et al. | |
| 2010/0244005 A1 | 9/2010 | Gyoda | |
| 2011/0063265 A1 | 3/2011 | Kim | |

* cited by examiner

*Primary Examiner* — Mary Ellen Bowman
(74) *Attorney, Agent, or Firm* — Kendall P. Woodruff

(57) ABSTRACT

Techniques are provided for removing thermal gradients from an organic light emitting diode (OLED) display. In one embodiment, an OLED display device includes a thermally conductive layer placed between electronic components housed within the device and the OLED display. Heat given off by the electronic components is transferred from warm to cold regions of the thermally conductive layer to create a more uniform ambient temperature across the back of the OLED display. Some embodiments indicate a position of the thermally conductive layer within layers of an OLED display stack (e.g., between a glass substrate and polyimide layer). Some embodiments include a specific range of thermal conductivities and/or thicknesses desired for the thermally conductive layer.

14 Claims, 4 Drawing Sheets

US 8,957,577 B2

INTEGRATED THERMAL SPREADING

BACKGROUND

The present disclosure relates generally to electronic display devices and more specifically to controlling thermal spreading in electronic display devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Organic light emitting diodes (OLEDs) are being increasingly employed for display applications in a wide variety of electronic devices, including such consumer electronics as televisions, computers, and handheld devices (e.g., cellular telephones, digital cameras, audio and video players, gaming systems, and so forth). Such OLED devices typically include a flat display panel having, among other things, an array of OLEDs that emit light to form an image. Each OLED includes one or more thin organic layers disposed between two charged electrodes (anode and cathode). The organic layers may include, for example, a hole injection layer, a hole transport layer, an emissive layer, an electron transport layer, and an electron injection layer. Upon application of an appropriate voltage to the OLED device, the injected positive and negative charges recombine in the emissive layer to produce light.

The luminance available from these organic layers generally degrades throughout the lifetime of the OLED. The lifetime of OLEDs used in electronic device displays may be affected by their temperature. For example, the OLED may work less efficiently at lower temperatures, requiring a slightly higher applied voltage to emit a desired amount of light, and OLED luminance generally degrades faster when the OLED is driven harder. Moreover, frequently used electronic components within an OLED device may produce excess heat, leading to high temperature concentrations in regions adjacent the OLED display. For example, a cellular phone user who engages in frequent telephone conversations may use the transmitter positioned near an upper region of the display, while a user who plays more video games may use the processor positioned near a lower region of the display. The OLEDs may degrade even faster in regions of the display exposed to these higher temperatures, resulting in non-uniform visual artifacts in the displayed image. In particular, white spots or image burn-in may result from temperature gradients within the display.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an organic light emitting diode (OLED) display device is provided. The display device includes an OLED display panel and a thermally conductive layer disposed adjacent the display panel. The thermally conductive layer facilitates heat transfer from high temperature to low temperature regions of the OLED display panel.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Organic materials are becoming increasingly utilized in display technology due to the low cost and high performance offered by organic electronic devices. However, typical organic light emitting diode (OLED) display devices may experience uneven degradation of certain regions of the display due to thermal gradient regions caused by the operation of certain electronic components within the device. One or more embodiments of the present disclosure spreads heat given off by the electronic components through a thermally conductive layer placed between the electronics and the OLED display.

Figure 1:
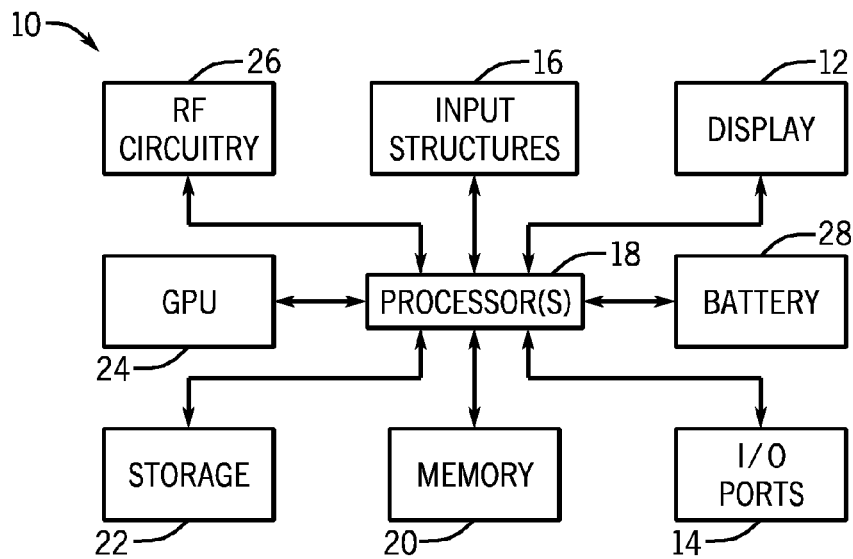
FIG. 1 is a block diagram of an electronic device, in accordance with aspects of the present disclosure.
Figure 2:
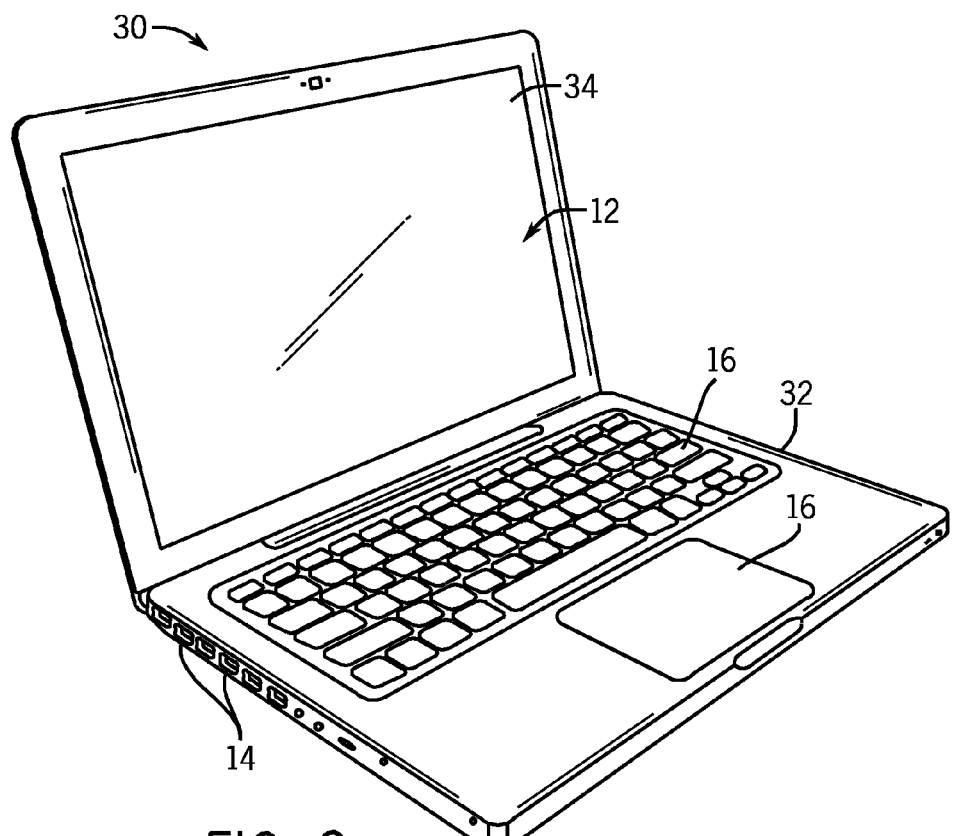
FIG. 2 is a perspective view of a computer in accordance with aspects of the present disclosure.
Figure 3:
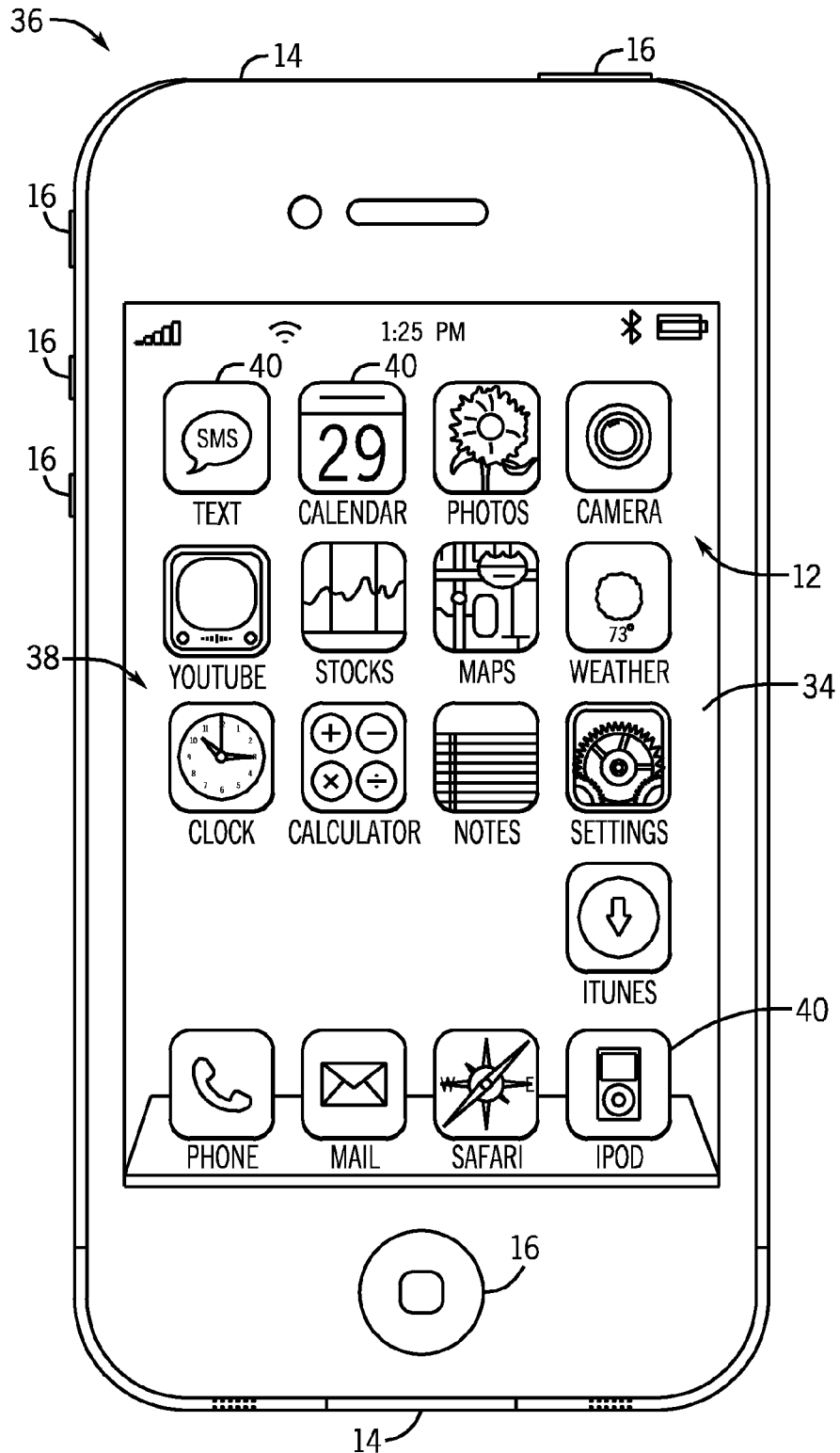
FIG. 3 is a front view of a handheld electronic device in accordance with aspects of the present disclosure.

With these foregoing features in mind, a general description of suitable electronic devices for implementing aspects of the present techniques is provided. In FIG. 1, a block diagram depicting various components that may be present in electronic devices suitable for use with the present techniques is provided. In FIG. 2, one example of a suitable electronic device, here provided as a computer system, is depicted. In FIG. 3, another example of a suitable electronic device, here provided as a handheld electronic device, is depicted. These types of electronic devices, and other electronic devices featuring OLED displays, may be used in conjunction with the present techniques. For example, these and similar types of electronic devices may utilize a thermally conductive material layer to facilitate heat spreading in accordance with aspects of the present disclosure.

As may be appreciated, electronic devices may include various internal and/or external components which contribute to the function of the device. For instance, FIG. 1 is a block diagram illustrating components that may be present in one such electronic device 10. Those of ordinary skill in the art will appreciate that the various functional blocks shown in FIG. 1 may include hardware elements (including circuitry), software elements (including computer code stored on a computer-readable medium, such as a hard drive or system memory), or a combination of both hardware and software elements. FIG. 1 is only one example of a particular implementation and is merely intended to illustrate the types of components that may be present in the electronic device 10. For example, in the presently illustrated embodiment, these components may include a display 12, input/output (I/O) ports 14, input structures 16, one or more processors 18, one or more memory devices 20, non-volatile storage 22, graphics processing unit (GPU) 24, cellular transmitter (RF circuitry) 26, and suitable power source (battery) 28.

The display 12 may be used to display various images generated by the electronic device 10. The display 12 may be any suitable display, such as an OLED display. Additionally, in certain embodiments of the electronic device 10, the display 12 may be provided in conjunction with a touch-sensitive element, such as a touchscreen, that may be used as part of the control interface for the device 10. The display 12 may include a stack of materials and organic compounds deposited in layers onto a substrate, wherein a thermally conductive layer is configured to remove thermal gradients within the display 12.

Processors 18 may provide the processing capability to execute the operating system, programs, user and application interfaces, and any other functions of the electronic device 10. The processors 18 may include one or more microprocessors, such as one or more "general-purpose" microprocessors, one or more special-purpose microprocessors or ASICS, or some combination of such processing components. For example, the processors 18 may include one or more reduced instruction set (RISC) processors, as well as video processors, audio processors, and the like. As will be appreciated, the processors 18 may be communicatively coupled to one or more data buses or chipsets for transferring data and instructions between various components of the electronic device 10. For example, one or more display drivers may aid in transferring display data from the processors 18 to the display 12.

Programs or instructions executed by processor(s) 18 may be stored in any suitable manufacture that includes one or more tangible, computer-readable media at least collectively storing the executed instructions or routines, such as, but not limited to, the memory devices and storage devices described below. Also, these programs (e.g., an operating system) encoded on such a computer program product may also include instructions that may be executed by the processors 18 to enable the device 10 to provide various functionalities.

The instructions or data to be processed by the one or more processors 18 may be stored in a computer-readable medium, such as a memory 20. The memory 20 may include a volatile memory, such as random access memory (RAM), and/or a non-volatile memory, such as read-only memory (ROM). The memory 20 may store a variety of information and may be used for various purposes. For example, the memory 20 may store firmware for electronic device 10 (such as basic input/output system (BIOS)), an operating system, and various other programs, applications, or routines that may be executed on electronic device 10. In addition, the memory 20 may be used for buffering or caching during operation of the electronic device 10.

The components of the device 10 may further include other forms of computer-readable media, such as non-volatile storage 22 for persistent storage of data and/or instructions. Non-volatile storage 22 may include, for example, flash memory, a hard drive, or any other optical, magnetic, and/or solid-state storage media. Non-volatile storage 22 may be used to store firmware, data files, software programs, wireless connection information, and any other suitable data.

In addition, the device 10 may include a GPU 24, which configures complicated visual data to be shown on the display 12, such as when playing games, videos, and the like. Data may be transmitted out of the device via RF circuitry 26 (e.g., voice data sent through a cellular transmitter of a mobile telephone). A rechargeable battery 28 may supply power to the processors 18 and other components of the device 10. Hardware components such as the GPU 24, RF circuitry 26, and battery 28 may produce heat when operated heavily or continually, and depending on the form of the device 10, these components may be located near the display 12.

The electronic device 10 may take the form of a computer system or some other type of electronic device. Such computers may include computers that are generally portable (such as laptop, notebook, tablet, and handheld computers), as well as computers that are generally used in one place (such as conventional desktop computers, workstations and/or servers). In certain embodiments, electronic device 10 in the form of a computer may include a model of a MacBook®, MacBook® Pro, MacBook Air®, iMac®, Mac® mini, or Mac Pro® available from Apple Inc. of Cupertino, Calif. By way of example, an electronic device 10 in the form of a laptop computer 30 is illustrated in FIG. 2 in accordance with one embodiment. The depicted computer 30 includes a housing 32, a display 12 (e.g., in the form of an OLED display 34 or some other suitable display), I/O ports 14, and input structures 16. One or more display drivers (not shown), disposed in the housing 32 adjacent the display 12, may produce heat near regions of the OLED display 34 where the OLEDs are driven harder.

The display 12 may be integrated with the computer 30 (e.g., such as the display of the depicted laptop computer) or may be a standalone display that interfaces with the computer 30 using one of the I/O ports 14, such as via a DisplayPort, Digital Visual Interface (DVI), High-Definition Multimedia Interface (HDMI), or analog (D-sub) interface. For instance, in certain embodiments, such a standalone display 12 may be a model of an Apple Cinema Display®, available from Apple Inc.

Although an electronic device 10 is depicted in the context of a computer in FIG. 2, an electronic device 10 may also take the form of other types of electronic devices. In some embodiments, various electronic devices 10 may include mobile telephones, media players, personal data organizers, handheld game platforms, cameras, and combinations of such devices. For instance, as generally depicted in FIG. 3, the device 10 may be provided in the form of handheld electronic device 36 that includes various functionalities (such as the ability to take pictures, make telephone calls, access the Internet, communicate via email, record audio and video, listen to music, play games, and connect to wireless networks). By way of further example, handheld device 36 may be a model of an iPod®, iPod® Touch, or iPhone® available from Apple Inc. In the depicted embodiment, the handheld device 36 includes the display 12, which may be in the form of an OLED display 34. The OLED display 34 may display various images generated by the handheld device 36, such as a graphical user interface (GUI) 38 having one or more icons 40.

In another embodiment, the electronic device 10 may also be provided in the form of a portable multi-function tablet computing device (not illustrated). In certain embodiments, the tablet computing device may provide the functionality of two or more of a media player, a web browser, a cellular phone, a gaming platform, a personal data organizer, and so forth. By way of example only, the tablet computing device may be a model of an iPad® tablet computer, available from Apple Inc.

With the foregoing discussion in mind, it may be appreciated that an electronic device 10 in either the form of a computer 30 (FIG. 2) or a handheld device 36 (FIG. 3) may be provided with a display 12 in the form of an OLED display 34. As discussed above, an OLED display 34 may be utilized for displaying respective operating system and/or application graphical user interfaces running on the electronic device 10 and/or for displaying various data files, including textual, image, video data, or any other type of visual output data that may be associated with the operation of the electronic device 10.

Figure 4:
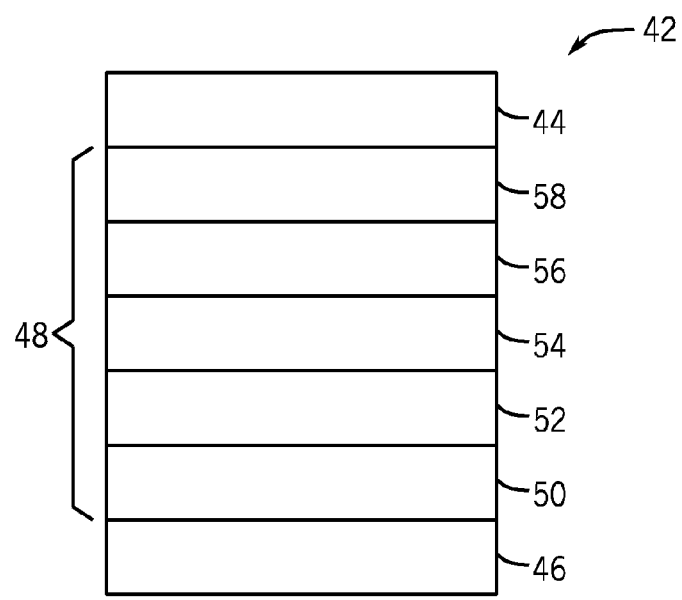
FIG. 4 is a cross-sectional side view of an organic light emitting diode (OLED) stack, in accordance with aspects of the present disclosure.

An OLED display 34 outputs visual data through an array of OLED devices arranged side by side on a flat panel or substrate. A cross-sectional side view of a portion of an OLED device for use in an electronic device 10 with OLED display 34 is illustrated in FIG. 4. The portion of the OLED device, also referred to as the OLED stack 42, may include a top electrode (i.e., cathode) 44 and a bottom electrode (i.e., anode) 46, with organic layers 48 disposed between the cathode 44 and the anode 46. In some embodiments, the organic layers 48 may include a hole injection layer 50 which may be disposed over the anode 46. A hole transport layer 52 may be disposed over the hole injection layer 50, and an emissive layer 54 may be disposed over the hole transport layer 52. An electron transport layer 56 may be disposed over the emissive layer 54, and an electron injection layer 58 may be disposed over the electron transport layer 56.

During operation of the electronic device 10 with OLED display 34, a voltage may be applied across the OLED stack 42. The voltage may charge the anode 46 to a positive charge and the cathode 44 to a negative charge, and electrons may flow through the stack 42 from the negatively charged cathode 44 to the positively charged anode 46. More specifically, electrons may be withdrawn from the organic materials adjacent to the anode 46 and injected to the organic materials adjacent to the cathode 44. The process of withdrawing electrons from the anode-side organic materials may also be referred to as hole injection and hole transport, and the process of injecting the electrons to the cathode-side organic materials may also be referred to as electron transport and electron injection. During the process of hole and electron transport/injection, electrons are withdrawn from the hole injection layer 50, transported through the hole transport layer 52 and the electron transport layer 56, and injected to the electron injection layer 58. Electrostatic forces may combine the electrons and holes in the emissive layer 54 to form an excited bound state which upon de-excitation, emits radiation having frequencies in the visible region of the electromagnetic spectrum (e.g., visible light). The frequency of the emitted radiation and the colors and/or characteristics of visible light may vary in different embodiments depending on the properties of the particular materials used in the OLED stack 42.

An OLED display 34 generally includes a plurality of OLED stacks 42 arranged as a matrix and deposited on a substrate, and may include additional layers positioned above and/or below the OLED stack 42. Over time and with use, the organic layers 48 may break down, causing the luminance emitted from the OLED stack 42 to degrade. This degradation process typically occurs at a faster rate for OLEDs exposed to higher temperatures due to higher driving voltages and/or ambient temperatures. For example, temperature gradients across an OLED display 34, over an extended period of time, may cause increased degradation of the OLED display 34 in high temperature regions. The accelerated loss of luminance may cause these regions to emit light at an undesired brightness and/or color, and such regions may be visually manifested as permanent white or yellow spots in the image on the OLED display 34.

High temperatures caused by operation of the OLED display 34 itself may also lead to temperature gradients across the OLED display 34. Some OLEDs may be driven more frequently and/or at higher voltages than other OLEDs. For example, a display 34 may show an image of a clock in a region of the display, and the clock image may feature a number of white pixels. White pixels on an OLED display 34 may require higher voltages across a number of OLEDs than the voltages required to produce other colored pixels. Therefore, images and icons, especially white ones, shown on regions of an OLED display 34 for an extended period of time may cause the OLED pixels to heat up in those regions. This heat may lead to temperature gradients across an OLED display 34, and, consequently, accelerated degradation of the OLED display 34.

Figure 5:
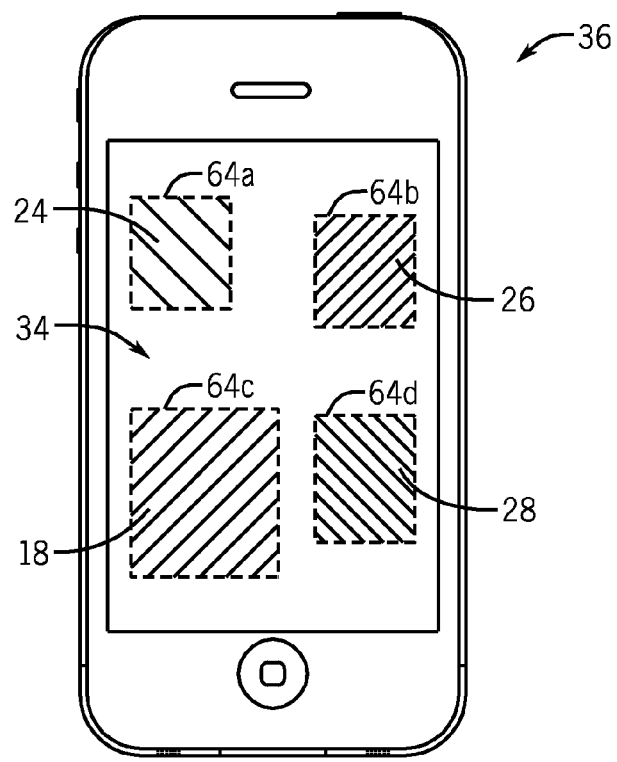
FIG. 5 is a top view of thermal gradients across a substrate of a handheld device, in accordance with aspects of the present disclosure.

Furthermore, heat given off by electronic components, especially the processor 18 and the RF circuitry 26, within the device 10 may transfer to local regions of the display 34, forming thermal gradient regions on the display 34. FIG. 5 illustrates a distribution of thermal gradient regions 64 that may exist on an OLED display 34 within a handheld device 36. It should be noted that FIG. 5 is meant to illustrate one possible layout of electronic components beneath the OLED display 34 of the handheld device 36, and many other layouts are possible.

As illustrated in FIG. 5, four temperature gradient regions 64a, 64b, 64c, and 64d are represented on the display 34, each corresponding to a different electronic component that may be housed within the handheld device 36. Such electronic components may include the GPU 24, RF circuitry 26, microprocessor 18, and battery 28. These, among others, are relatively large electronic components within the handheld device 36 that may produce heat when operated for an extended period of time. For example, the battery 28 may heat up while the electronic device 10 is receiving charge, the RF circuitry 26 of a portable telephone may heat up during a lengthy telephone call, the GPU 24 may heat up as a graphically complicated game or video is displayed on the electronic device 10, and the microprocessor 18 may heat up while the device is used heavily to process information.

The different electronic components may produce heat at different temperatures, which may result in differentially affecting the temperatures at each of the thermal gradient regions 64 across the display 34. The different temperatures which affect these thermal gradient regions 64 may also change over time as certain electronic components are used more or less often. In addition, it is possible that not all major electronic components housed within the handheld device 36 may be operating simultaneously or in a manner which produces a steady state thermal gradient profile. For example, a user may play games with complicated graphics on the handheld device without transmitting data out of the device, in which case thermal gradient regions 64a and 64c may form on the display 34 over regions of the display 34 which are adjacent to the GPU 24 and microprocessor 18, but not over regions of the display 34 adjacent to the RF circuitry 26. Thermal gradient regions 64 across the display 34 may also be affected by the placement of the electronic components within the handheld device 36, as certain components may be located closer to or further from the display 34 plane.

Figure 6:
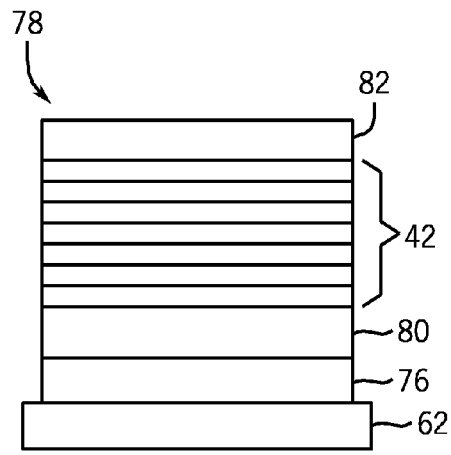
FIG. 6 is a side view of a display stack, including the OLED stack of FIG. 4, in accordance with aspects of the present disclosure.

To prevent temperature gradient regions 64 in the display 34 from causing uneven image degradation of the OLED display 34 (e.g., white spots), a layer of material with high thermal conductivity may be deposited between heat-producing components and the OLED stacks 42. As illustrated in FIG. 6, a thermally conductive layer 76 may form one layer of an OLED display stack 78. The OLED display 34 of an electronic device 10 may feature all the layers shown in the display stack 78, which may be continuous layers extending over the entire display area and disposed above or below an array of OLED stacks 42. The display stack 78 may include, for example, a substrate 62, conductive layer 76, polyimide layer 80, OLED stack 42, and any additional protective layers such as thin film encapsulation layer 82.

Structural support of the display stack 78 is provided by the substrate 62, on which subsequent layers may be disposed. The substrate 62, which may be glass, separates other layers of the display stack 78 from the internal components of the electronic device 10. The polyimide layer 80 may act as an electrical insulator between the OLED stack 42 and the thermally conductive layer 76, preventing current that flows into the OLED stack 42 from flowing into other components of the display stack 78 through the thermally conductive layer 76. The thin film encapsulation 82 may be disposed above the OLED stack 42 to form a translucent boundary over the OLED stack 42, allowing light emitted from the OLED stack 42 to pass through and form an image on the OLED display 34.

A material with thermal conductivity within the range of approximately 200 Watts per meter Kelvin (W/mK) to 8000 W/mK may be appropriate for the thermally conductive layer 76. Some suitable materials for the thermally conductive layer 76 include copper (400 W/mK), graphite (240 W/mK), graphene (4800-5300 W/mK), carbon nanotubes (3500 W/mK), aluminum (237 W/mK), gold (318 W/mK) and silver (429 W/mK). In some embodiments, the thermally conductive layer 76 may have a thickness ranging from approximately 20 microns to 500 microns.

Some OLED displays 34 include an optically opaque layer on the back surface. This layer could be paint, PVD, or black-colored polyimide or PET. This is a functional layer, meant to absorb ambient light that passes through the display, improving contrast. However, the thermal conductivity of PET is approximately 0.2 W/mK, which is not high enough to distribute heat across the layer and eliminate thermal gradient regions 64. Thus, in some embodiments, a conductive layer 76 may replace, or be added to, a PET layer within the display stack 78, in order to improve heat spreading across the area beneath an array of OLED stacks 42.

Figure 7:
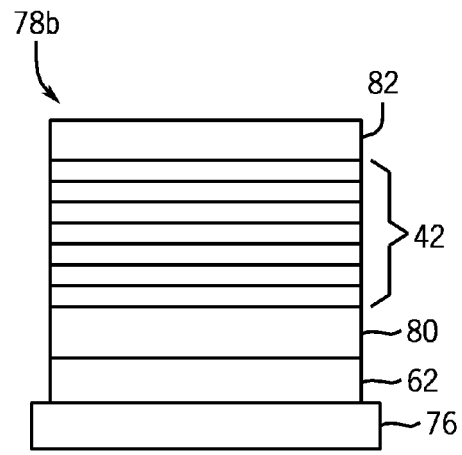
FIG. 7 is a side view of another arrangement of a display stack, including the OLED stack of FIG. 4, in accordance with aspects of the present disclosure.

A discussed above, the thermally conductive layer 76 may be disposed between the substrate 62 and polyimide layer 80, as shown in the illustrated embodiment, or beneath the substrate 62, between electronic components housed within the device and the substrate 62. Other arrangements or additions of layers within the display stack 78 may also be possible, as will be appreciated by those skilled in the art. For example, in some embodiments, the thermally conductive layer 76 may be disposed beneath the substrate 62, as illustrated in FIG. 7.

In addition, a variety of thermally conductive materials may be appropriate for the thermally conductive layer 76 in OLED displays 34 for different electronic device 10 applications. That is, certain conductive materials may be better suited for certain OLED displays 34, depending on the location and expected heat generation of electronic components of the system located beneath the OLED display 34.

Figure 8:
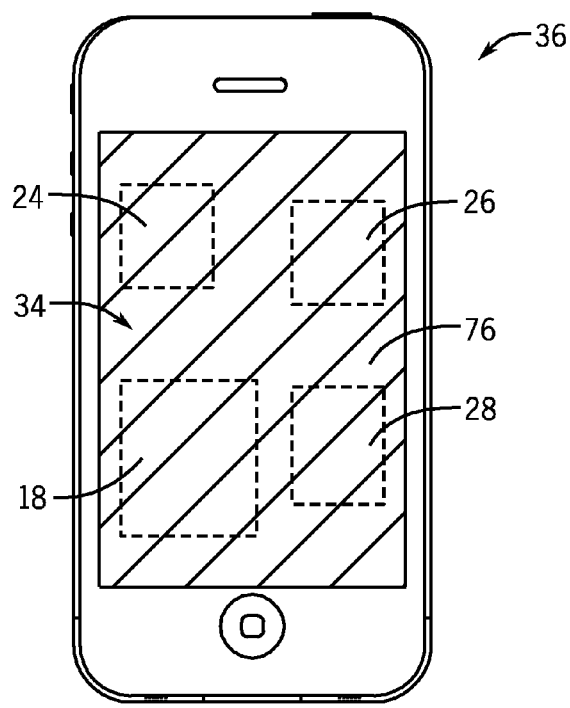
FIG. 8 is a top view of thermal spreading in a display due to a thermally conductive layer of the handheld device of FIG. 5, in accordance with aspects of the present disclosure.

Heat from thermal gradient regions 64 across the display 34 may spread throughout the thermally conductive layer 76 to create a more uniform temperature distribution across the OLEDs in a device display 12. FIG. 8 illustrates the result of integrated thermal spreading that may occur in a conductive layer 76 of the handheld device 36 introduced in FIG. 5. The rectangles with dashed outlines indicate the layout of the electronic components located beneath the OLED display 34. As represented by the diagonal lines across the display area, the thermally conductive layer 76 may facilitate the distribution of temperature across the plane of the OLED display 34. Heat may enter the bottom of the thermally conductive layer 76 in concentrated regions as indicated by the thermal gradient regions 64 in the substrate 62 of FIG. 5. The high thermal conductivity of the thermally conductive layer 76 facilitates transfer of the incoming heat from relatively high temperature regions to lower temperature regions, spreading the heat throughout the thermally conductive layer 76. At the top of the thermally conductive layer 76, heat from the electronic components may enter the remaining layers of the OLED display 34 relatively uniformly across the display area. Thus, in accordance with the present techniques, the OLEDs may degrade more uniformly with time and use, preventing white spots and image burn-in from occurring at positions adjacent to heavily used electronic components.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An organic light emitting diode (OLED) display device comprising:
   an OLED display panel;
   a thermally conductive layer disposed adjacent the OLED display panel, wherein the thermally conductive layer has a thickness of approximately 20 microns to 500 microns and is configured to transfer heat from a relatively higher temperature region of the OLED display panel to a relatively lower temperature region of the OLED display panel; and
   a substrate, wherein the thermally conductive layer is disposed over the substrate and wherein the OLED display panel is disposed over the thermally conductive layer.

2. The display device of claim 1, wherein the display device comprises different components which generate different amounts of heat.

3. The display device of claim 2, wherein the different components comprise electronic components disposed within the display device adjacent the thermally conductive layer opposite the OLED display panel.

4. The display device of claim 2, wherein the different components comprise a processor, GPU, transmitter, battery, display driver, or any combination thereof.

5. The display device of claim 2, wherein the different amounts of heat generated by the different components varies with respect to time.

6. The display device of claim 1, wherein the thermally conductive layer has a thermal conductivity of approximately 200 W/mK to 8000 W/mK.

7. The display device of claim 1, comprising a plurality of layers disposed adjacent the OLED display panel in addition to the thermally conductive layer.

8. A method of operating an organic light emitting diode (OLED) display device, comprising:
generating heat in the display device adjacent an OLED display panel; and
spreading the heat across the OLED display panel with a thermally conductive layer disposed between a glass display substrate and a light emitting diode layer, wherein the light emitting diode layer emits light away from the glass display substrate.

9. The method of claim 8, wherein the generating heat comprises generating heat from a processor, GPU, transmitter, battery, display driver, or any combination thereof.

10. The method of claim 8, wherein the spreading the heat across the OLED display panel comprises transferring heat from a relatively higher temperature region of the OLED display panel to a relatively lower temperature region of the OLED display panel.

11. An electronic device display, comprising:
a polymer layer;
an organic light emitting layer on the polymer layer;
a glass substrate; and
a thermally conductive layer interposed between the glass substrate and the organic light emitting diode layer, wherein the thermally conductive layer transfers heat between regions of the electronic device display.

12. The electronic device display defined in claim 11 wherein the polymer layer comprises:
a polyimide layer that prevents current flow between the light emitting diode layer and the thermally conductive layer.

13. The electronic device display defined in claim 11 wherein the thermally conductive layer is directly adjacent to the glass substrate.

14. The electronic device display defined in claim 11 wherein the thermally conductive layer comprises at least one thermally conductive material selected from the group consisting of: copper, graphite, graphene, carbon nanotubes, aluminum, gold, and silver.

* * * * *